(12) United States Patent
Balaschak et al.

(10) Patent No.: US 8,154,183 B2
(45) Date of Patent: Apr. 10, 2012

(54) MITIGATING SHORTING RISKS IN ENCAPSULATED ORGANIC LIGHT EMITTING DEVICES (OLEDS)

(75) Inventors: Edward James Balaschak, Avon, OH (US); James Michael Kostka, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/717,151

(22) Filed: Mar. 4, 2010

(65) Prior Publication Data
US 2011/0215706 A1  Sep. 8, 2011

(51) Int. Cl.
*H01J 1/88* (2006.01)
*H01J 1/62* (2006.01)
*H05K 5/06* (2006.01)

(52) U.S. Cl. .................. 313/281; 313/511; 174/50.5

(58) Field of Classification Search .............. 313/381, 313/511–512; 174/152 E
See application file for complete search history.

(56) References Cited

U.S. PATENT DOCUMENTS

| | | | |
|---|---|---|---|
| 6,278,235 B1* | 8/2001 | Nakatani et al. | 313/497 |
| 7,015,640 B2 | 3/2006 | Schaepkens et al. | |
| 7,580,014 B2 | 8/2009 | Tanaka et al. | |
| 2004/0051451 A1* | 3/2004 | Kawase et al. | 313/512 |
| 2004/0121508 A1* | 6/2004 | Foust et al. | 438/99 |
| 2005/0242721 A1* | 11/2005 | Foust et al. | 313/511 |
| 2007/0173165 A1* | 7/2007 | Taguchi et al. | 445/24 |
| 2009/0302760 A1 | 12/2009 | Tchakarov et al. | |
| 2010/0294526 A1* | 11/2010 | Farquhar et al. | 174/50.5 |
| 2010/0295443 A1 | 11/2010 | Roberts et al. | |

FOREIGN PATENT DOCUMENTS
WO  WO 2010/005301 A1  1/2010

OTHER PUBLICATIONS

PCT/US2011/026236 International Search Report and Written Opinion, mailed Apr. 14, 2010.

* cited by examiner

*Primary Examiner* — Karabi Guharay
*Assistant Examiner* — Michael Santonocito
(74) *Attorney, Agent, or Firm* — Fay Sharpe LLP

(57) ABSTRACT

A generally planar, flexible light source assembly or OLED device includes a generally planar, flexible light emitting member having opposite first and second surfaces. An impermeable backsheet is disposed along the first surface of the light emitting surface and includes a conductive portion and an opening through the backsheet. A conductive tab or cover is received over the opening, and an insulator is disposed between the tab cover and the opening to mitigate the risk of electrical contact between the components. The insulator can be precut washer-like members or an applied insulating material situated between the conductive components of the light source assembly that pose a potential for shorting. Using tabs with burr-free edges also mitigates against the risk of electrical shorting.

19 Claims, 6 Drawing Sheets

MITIGATING SHORTING RISKS IN ENCAPSULATED ORGANIC LIGHT EMITTING DEVICES (OLEDS)

BACKGROUND OF THE DISCLOSURE

The present disclosure relates to a light source, and particularly a light emitting device such as an organic light emitting diode panel and associated connection arrangements, as well as an associated method of assembling such a light panel.

Organic light emitting diode (OLED) devices are generally known in the art. An OLED device typically includes one or more organic light emitting layer(s) disposed between electrodes. For example, a cathode, organic layer, and a light-transmissive anode formed on a substrate emit light when current is applied across the cathode and anode. As a result of the electric current, electrons are injected into the organic layer from the cathode and holes may be injected into the organic layer from the anode. The electrons and holes generally travel through the organic layer until they recombine at a luminescent center, typically an organic molecule or polymer. The recombination process results in the emission of a light photon usually in the visible region of the electromagnetic spectrum.

The layers of an OLED are typically arranged so that the organic layers are disposed between the cathode and anode layers. As photons of light are generated and emitted, the photons move through the organic layer. Those that move toward the cathode, which generally comprises a metal, may be reflected back into the organic layer. Those photons that move through the organic layer to the light-transmissive anode, and finally to the substrate, however, may be emitted from the OLED in the form of light energy. Some cathode materials may be light transmissive, and in some embodiments light may be emitted from the cathode layer, and therefore from the OLED device in a multi-directional manner. Thus, the OLED device has at least a cathode, organic, and anode layers. Of course, additional, optional layers may or may not be included in the light source structure.

Cathodes generally comprise a material having a low work function such that a relatively small voltage causes the emission of electrons. Commonly used materials include metals, such as gold, gallium, indium, manganese, calcium, tin, lead, aluminum, silver, magnesium, lithium, strontium, barium, zinc, zirconium, samarium, europium, and mixtures or alloys of any two or more thereof. On the other hand, the anode layer is generally comprised of a material having a high work function value, and these materials are known for use in the anode layer because they are generally light transmissive. Suitable materials include, but are not limited to, transparent conductive oxides such as indium tin oxide (ITO), aluminum doped zinc oxide (AZO), fluorine doped tin oxide (FTO), indium doped zinc oxide, magnesium indium oxide, and nickel tungsten oxide; metals such as gold, aluminum, and nickel; conductive polymers such as poly(3,4-ethylenedioxythiophene) poly(styrenesulfonate) (PEDOT;PSS); and mixtures and combinations or alloys of any two or more thereof.

Preferably, these light emitting or OLED devices are generally flexible (or Conformable), i.e., are capable of being bent into a shape having a radius of curvature of less than about 10 cm. These light emitting devices are also preferably large-area, which means the devices have a dimensional area greater than or equal to about 10 cm$^2$, and in some instances are coupled together to form a generally flexible, generally planar OLED panel comprised of one or more OLED devices which has a large surface area of light emission.

OLEDs are typically encapsulated or hermetically sealed since moisture and oxygen have an adverse impact on the OLED device. Various electrical pathways must be established in the light emitting panel, and as a result of these pathways and connections, there is the potential risk of an electrical short developing. For example, a preferred manner of establishing an electrical pathway with a light emitting device is to form openings or holes at selected spaced locations in an otherwise impermeable backsheet. In its simplest form, the impermeable backsheet includes a metal foil, such as aluminum foil or other conductive material, that is coated on both surfaces with a polymer insulator. Therefore, it is possible to short the OLED panel if conductive patches that are used to cover the openings of the backsheet to provide an electrical pathway into the hermetic package inadvertently contact an internal metal foil in the backsheet barrier. This can generally happen in two ways. First, a conductive surface of the patch touches the metal foil in the region or along an edge of the opening that was cut from the impermeable backsheet. In the second shorting scenario, edges or burrs typically found on the perimeter edges of the patch puncture the insulative polymer layer of the backsheet and make undesired contact with the conductive metal foil of the backsheet.

Therefore, it is important to mitigate the shorting risks associated with encapsulated OLEDs and the like in order to provide a more reliable product, particularly product designs that need to withstand flexing applications.

SUMMARY OF THE DISCLOSURE

A generally planar, generally flexible light source assembly includes a generally planar light emitting member having first and second surfaces. An impermeable backsheet is disposed along a first surface of the light emitting member and includes a metallic portion encased within a non-conductive film. An adhesive (thermoplastic or PSA) is disposed on the inside surface of the backsheet to allow one to hermetically encapsulate the OLED device via heat, pressure, inductive, or IR sealing processes. A cover or patch is received over the opening in the backsheet and an insulator is provided between the cover and the opening to mitigate a risk of electrical contact therebetween.

In one preferred arrangement, the insulator is a bead of viscous insulating material applied and cured around the opening in the backsheet.

In another embodiment, the insulator includes a precut first insulator washer received along a first surface of the backsheet around the opening.

The first insulator washer has an inner opening dimension less than a dimension of the opening in the backsheet.

The insulator may include a precut second insulator washer received along an opposite, second surface of the backsheet around the opening.

In a similar manner, the second insulator washer has an inner opening dimensioned less than a dimension of the opening in the backsheet.

In another arrangement, the insulator is positioned within the opening in covering relation along an inner terminal edge of the conductive portion of the backsheet.

In still another solution, the insulator is a viscous sealant such as an epoxy, shellac, silicone adhesive spaced between the conductive tab of the backsheet and/or disposed in covering relation along the inner diameter of the opening.

Still another solution is to provide rolled or formed edges on the conductive tab or patch that decrease the prospects for burrs.

An associated method of manufacture of the generally planar light source assembly includes providing a generally planar light emitting member having opposed first and second surfaces. The method includes locating an impermeable backsheet having a conductive portion and an opening through the backsheet that is disposed along the first surface of the light emitting member. A conductive cover (sometimes referred to as a patch or tab) is placed over the opening, and the method further includes applying an insulator between the cover and the opening to mitigate any risk of electrical contact therebetween.

The insulator applying step includes introducing an electrically insulated material around the opening, wherein one preferred method includes coating (spray, caulk, etc.) an inner surface of the opening with an insulator material.

Another preferred method includes pre-forming insulator washers, and more particularly dimensioning an opening through the washers to be less than the dimension of the backsheet opening. Rounding the edge of the cover, for example by laser cutting the cover to provide a burr-free edge, also mitigates the risk of electrical contact.

A primary advantage is associated with the improved reliability of the final assembly.

Another advantage resides in the decreased prospects for electrical shorting using one or more of the solutions.

Still another benefit is associated with the ease and inexpense associated with the solutions.

Still other benefits and advantages of the present disclosure will become apparent from reading and understanding the following detailed description.

DETAILED DESCRIPTION OF THE PREFERRED EMBODIMENTS

Figure 1:
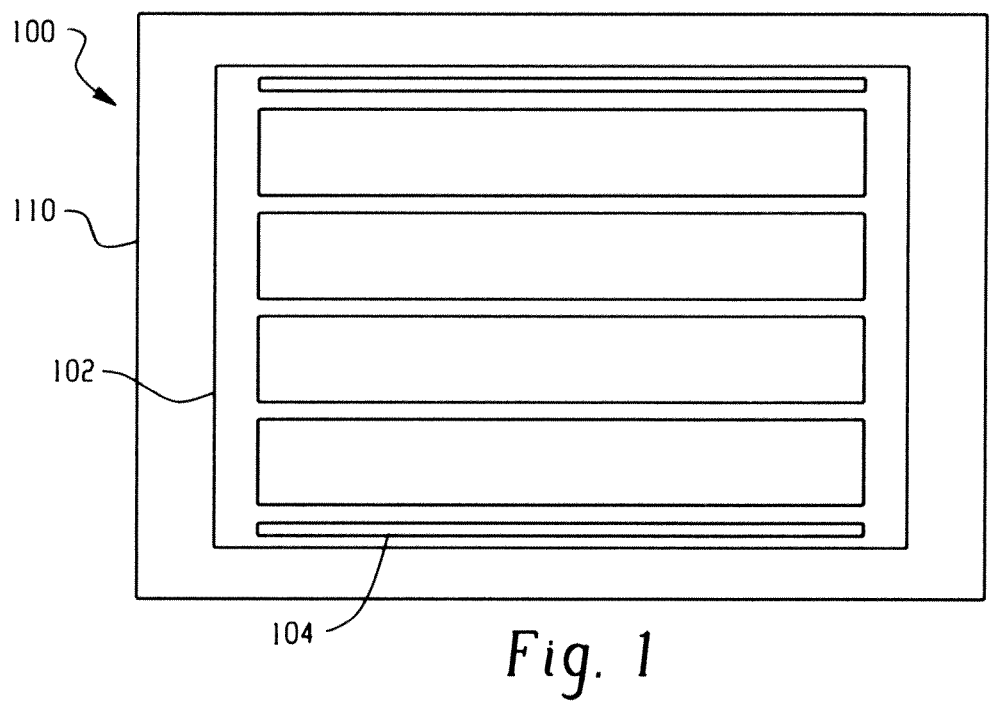
FIG. 1 is a plan view of an OLED panel.
Figure 2:
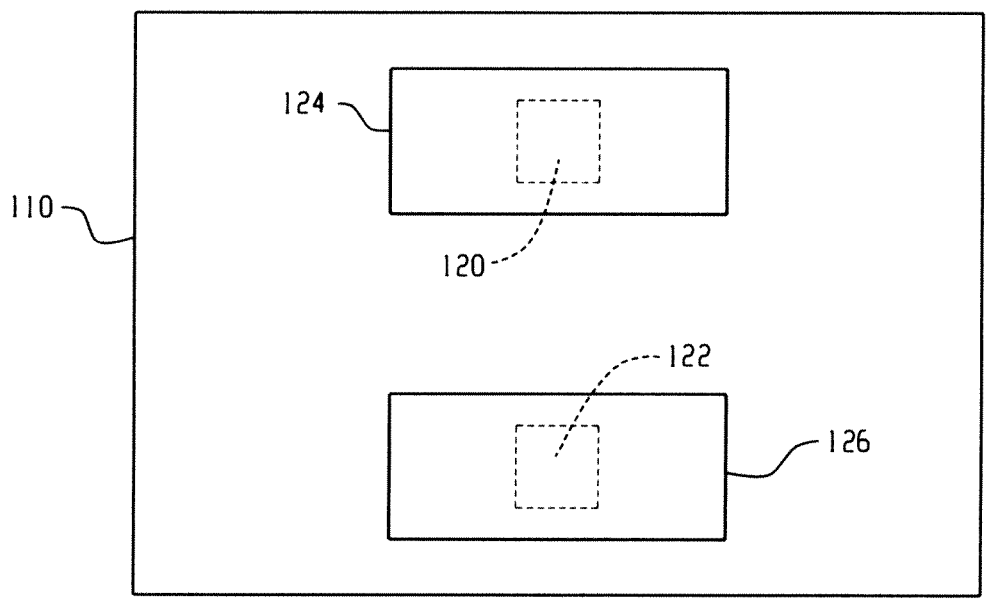
FIG. 2 is a plan view of a composite film backplane or backsheet with openings and conductive patches used to provide an electrical pathway into the hermetic package.
Figure 3:
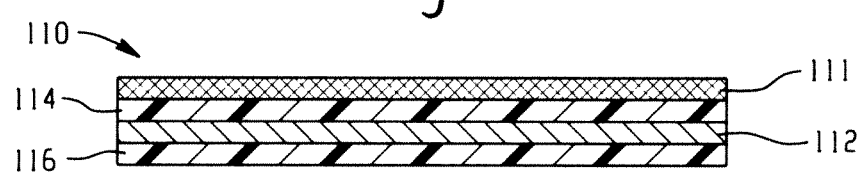
FIG. 3 is a cross-sectional view taken through a portion of the composite backsheet of FIG. 2.
Figure 4:
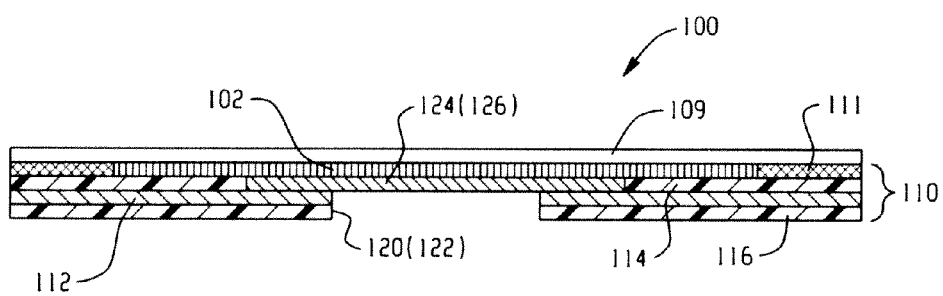
FIG. 4 illustrates a potential problem of an internal patch shorting with the backsheet.

Turning first to FIGS. 1-4, a generally planar and flexible light source or organic light emitting device (OLED) device 102, is known to those skilled in the art and can be sealed in a hermetic package to form a flexible light panel 100. The OLED device is adhesively sealed between two impermeable films, at least one of which is transparent to allow the generated light to escape. The transparent ultrahigh barrier (UHB) film is generally known in the art, and particular details of the structure and function of the UHB are shown and described in commonly owned U.S. Pat. No. 7,015,640. Electricity can be provided to the bus structure 104 of the encapsulated OLED device through openings in the backsheet. As more particularly evident in FIGS. 3 and 4, the backsheet 110 is typically an impermeable material and in a preferred embodiment is a composite assembly that includes a metal foil 112 that is encased or encapsulated within a polymer film or insulator coating represented in cross-section by portions 114, 116 on opposite faces of the metal foil 112. Additionally, in the preferred embodiment, a thermoplastic adhesive 111 is disposed over the entirety of the polymeric insulator surface 114 to bond the impermeable backsheet to a transparent ultra high barrier UHB film 109, thus hermetically sealing the OLED device within the panel. The backsheet 110 exhibits excellent moisture and oxygen barrier characteristics due to the incorporation of a metal foil. It is desired that the non-conductive film or insulator coating portion extend over perimeter edges of the metal foil in order to minimize inadvertent contact with other conductive materials. However, where openings are formed in the backsheet, such as first and second openings 120, 122 (FIG. 2), the potential exists for a portion of the metal foil along the inner surface or interior portion of the opening (FIG. 4) to be exposed.

A transfer contact tab (or occasionally referenced as a patch or cover) 124, 126 such as a nickel, aluminum foil or similar conductive material, forms a portion of an electrical pathway to the OLED device. The patches or tabs 124, 126 cover the openings in the backsheet (see FIGS. 2 and 4) and serve as a potential shorting path to the metal layer of the backsheet as briefly described in the Background. For example, as illustrated in exaggerated form in FIG. 4, heat and/or pressure from processing steps pushes a transfer tab 124 (126) through to contact with the metal layer 112 of the backsheet 110. If more than one internal patch comes into electrical contact with the metal foil in the backsheet, electrical shorting can occur resulting in an unreliable or failed product. Further, in those instances where the internal tab 124, 126 is cut from a sheet of material, a burr or sharp edge may remain along the cut edge. In response to the processing pressure, the burr cuts through the protective non-conductive film or insulator coating 114 that normally protects the metal foil 112 of the backsheet and can cause an electrical short.

Figure 5:
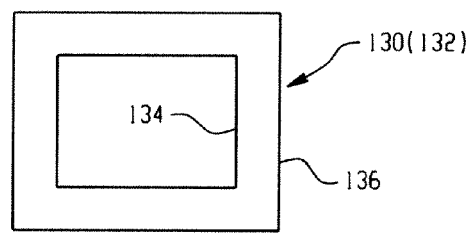
FIG. 5 is a plan view of a precut insulator or plastic film washer.
Figure 6:
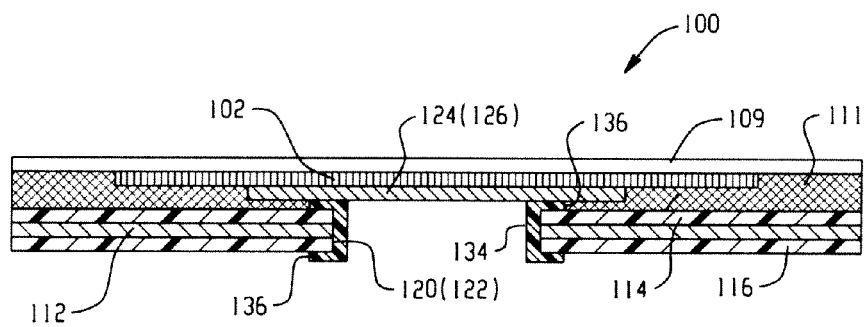
FIG. 6 is a cross-sectional view similar to FIG. 4 and showing the inclusion of first and second precut insulators into the assembly.

One proposed solution illustrated in FIGS. 5 and 6 is to position an insulator between the internal patch 124, 126 and the metal layer of the impermeable backsheet. The exemplary insulator in this embodiment is a precut non-conductive washer, or first and second non-conductive washers 130, 132. The particular configuration of the insulator or washer 130 (132) is not particularly pertinent. The precut insulator preferably has a generally minimal thickness so as not to unduly add to the overall thickness of the composite light panel, and the precut insulator has a generally annular shape in which interior opening 134 and outer perimeter 136 are dimensioned to provide sufficient overlap such that they can touch each other and provide insulating protection between the internal tab 124, 126 and the openings 120, 122 formed in the backsheet. Additionally, the non-conductive washer should have a high melt temperature, as to prevent softening and mechanical deformation during the heat seal process. Preferably, the opening 134 through the precut insulator washers 130, 132 is slightly less than the interior dimension 120, 122 of the openings through the backsheet (FIG. 5). In this manner, if heat and/or pressure deforms the OLED device, the inner perimeter portion 134 of the precut insulator washer 130 (132) will effectively isolate the internal tab from the metal film 112 of the backsheet. Preferably these insulator washers are coated with an adhesive, such that when applied to the front and back of the backsheet 110, a seal is made around the exposed foil in the opening, as is illustrated in FIG. 6.

Figure 7:
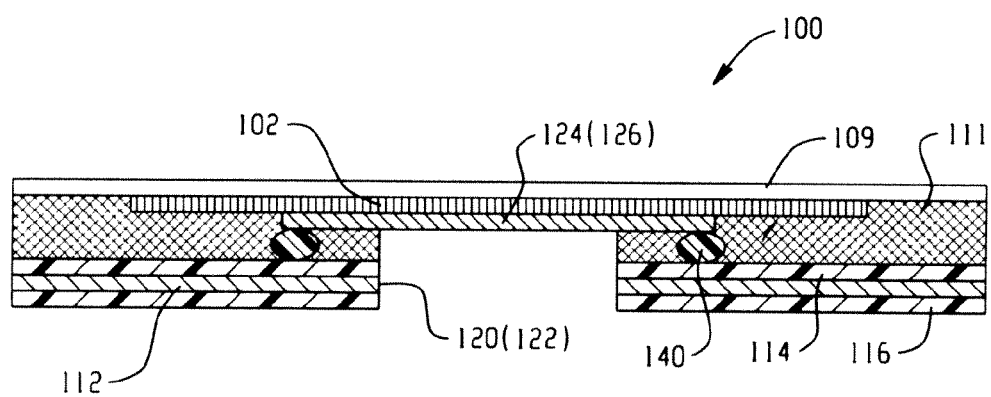
FIG. 7 illustrates application of an insulating viscous and cured material along a first surface of the backsheet adjacent the edges of the patch.

Turning to FIG. 7, the insulator 140 adopts a slightly different configuration from the precut insulator washers of FIGS. 5 and 6. Here, the insulator is a viscous and cured sealant or insulation material interposed between the tab 124, 126 and the backsheet. More particularly, the insulator in a preferred form is a liquid epoxy or plastic that is applied in a generally continuous bead or droplet around the perimeter of the tab, as shown in FIG. 7, serves to support the tab in slightly spaced relation relative to the backsheet and thereby further electrically isolate the tab from possible inadvertent electrical contact (i.e., shorting) with the metal layer 112 of the backsheet.

Figure 8:
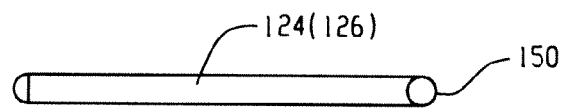
FIG. 8 is an enlarged view of the cover or tab fabricated with burr-free edges.

FIG. 8 is representative of the tab 124, 126. As mentioned above, when cut from a sheet of material, the cutting process often leaves a sharp edge or burr that may cause potential shorting issues as described in association with FIG. 4. By providing for a rolled or formed edge 150 there is less chance of a sharp edge or burr cutting through the protective film 114 of the backsheet. One manner of achieving this rolled, smooth edge 150 is to cut the tabs from a sheet of material with a laser because a laser cut advantageously results in a rolled or smoothly rounded edge 150 as illustrated in FIG. 8, and thus less likely to cut through the protective film that encases the metal layer 112 of the backsheet.

Figure 9:
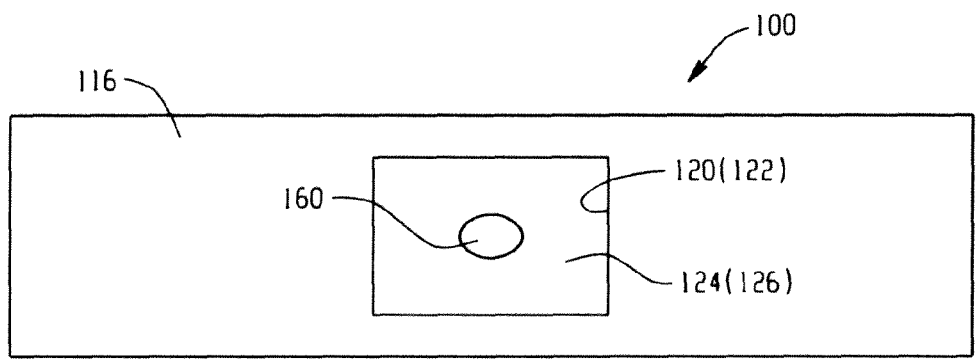
FIGS. 9-11 are plan and cross-sectional views of a generally planar light source assembly where the potential exists for an external bus connection shorting with the conductive layer of the backsheet.
Figure 10:
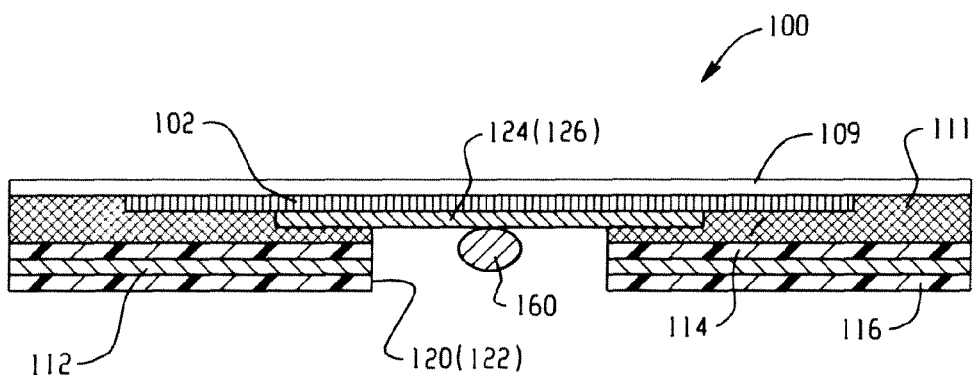
Figure 11:
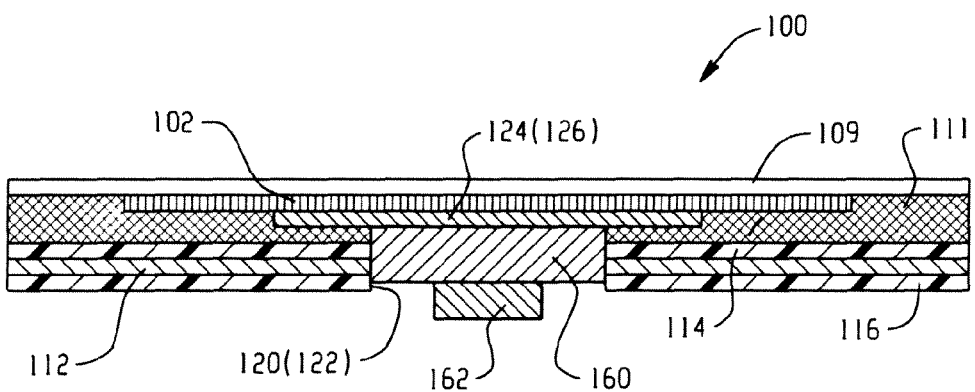

FIGS. 9-11 illustrate another potential shorting issue with OLED devices where an opening is cut through the backsheet. Like reference numerals will refer to like components, and new numerals identify new components where deemed necessary. The OLED panel 100 includes an OLED device 102, an impermeable backsheet 110, a transparent barrier film 109, and a means of providing electricity to the OLED device in the hermetic package 120, 122, 124, 126. One of the openings 120, 122 is shown in enlarged form in FIG. 9 and a portion of the transfer contact tab 124 (126) is seen through the opening. Further, a conductive material 160 is provided in the opening 120 (122). The conductive material in one exemplary embodiment is a conductive epoxy or adhesive 160 intended to complete the electrical pathway between the internal patch and an external bus 162 (FIG. 11). Although desired for completing the electrical connection of the OLED device, if the inner perimeter edge of the opening through the backsheet leaves an exposed surface of the metal layer 112, there is the potential for shorting to the backsheet or the external bus connection through the conductive epoxy or adhesive. Thus, although the conductive adhesive 160 is desirable for completing the electrical connection between the external bus 162 and the internal tab 124 (126), during processing the conductive adhesive may spread and make inadvertent electrical connection with the metal layer 112 of the backsheet, as is illustrated in FIG. 11.

Figure 12:
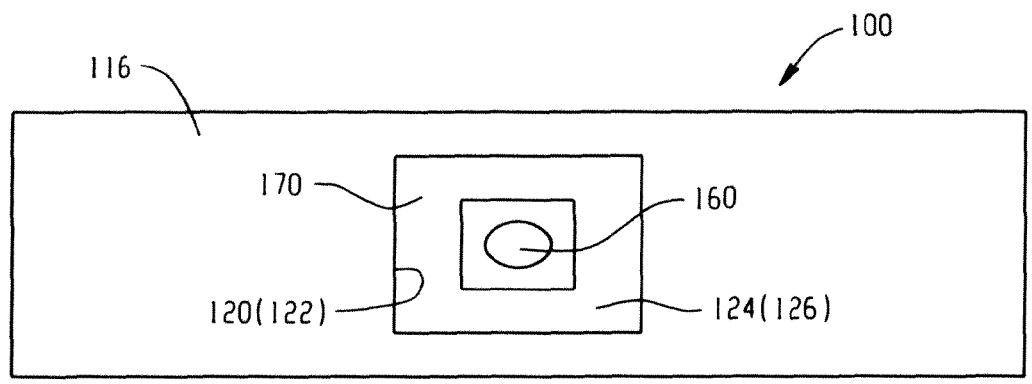
FIGS. 12-14 illustrate one proposed solution to potential shorting between the external bus connection and the backsheet.
Figure 13:
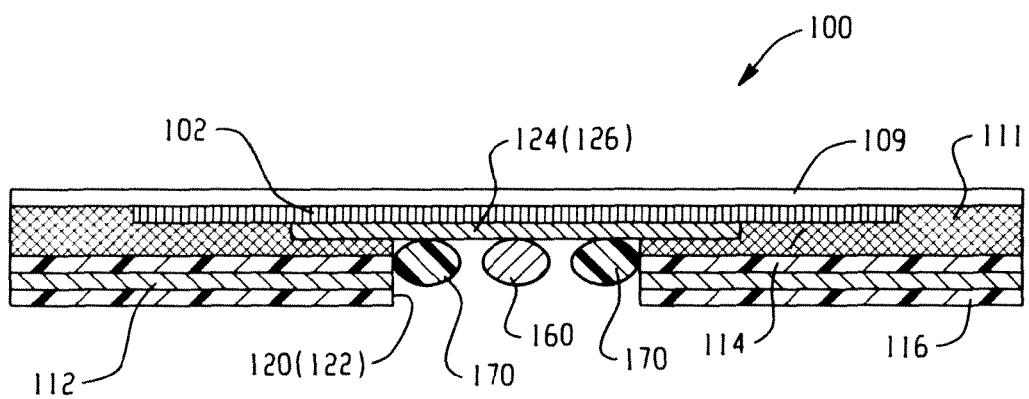
Figure 14:
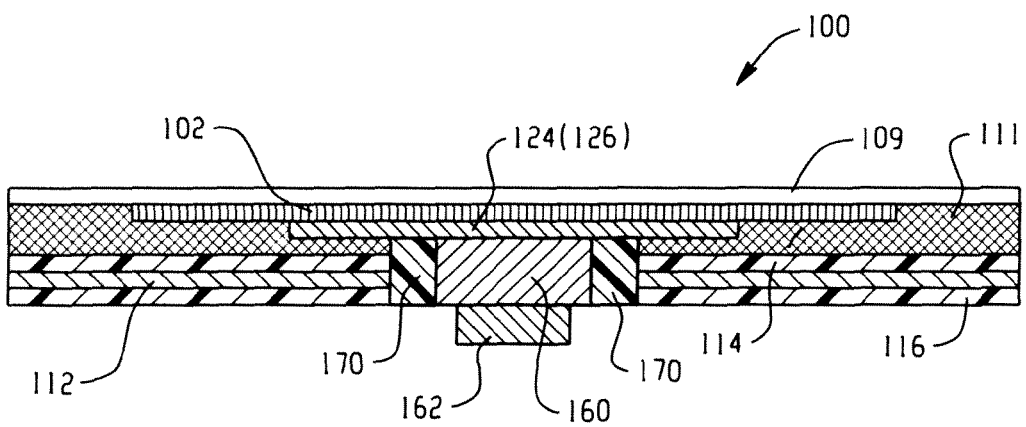
Figure 15:
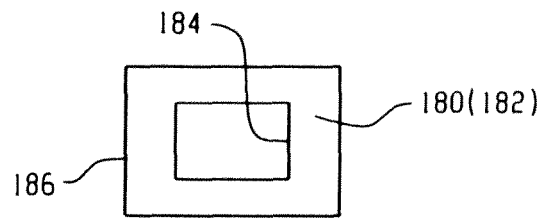
FIGS. 15-17 show yet another proposed solution to the potential for the external bus connection to short with the backsheet.

To decrease the potential for shorting of the external bus connection in the embodiment of FIGS. 9-11, one proposed solution is shown in FIGS. 12-14. Particularly, an insulator 170 is provided. The insulator 170 which is oftentimes a viscous and cured adhesive or sealant material that is not electrically conductive, i.e., electrically insulative, is preferably positioned within an inner perimeter of the opening 120 (122) formed in the backsheet along the terminal inner edges of the backsheet layers (conductive metal layer 112 and the protective layers 114, 116). The insulator 170 preferably has a depth and is applied in a continuous manner along the inner periphery forming the opening sufficient to cover any potentially exposed inner edge of the metal film as represented in FIGS. 13 and 14. The insulator is positioned between the internal tab 124 and the metal layer 112 of the backsheet, and also advantageously positioned between the conductive epoxy 160 and the inner edge of the metal layer of the backsheet. By applying an insulative epoxy or sealant around the inner edge of the opening, or for external patches this can be coupled with a small amount of conductive epoxy in the middle, the desired insulator 170 is established in the OLED device that mitigates or reduces the chance for electrical shorting. It is also contemplated that other forms of insulator could be used such as coating (spray, caulk, etc.) the inner surface of the opening, again to provide an additional insulating layer of protection between potential conductive components that could inadvertently and undesirably come into electrical contact.

Figure 16:
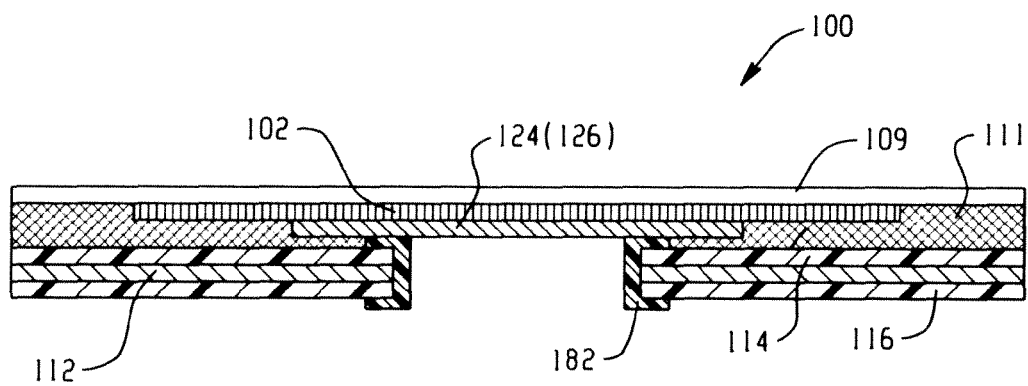
Figure 17:
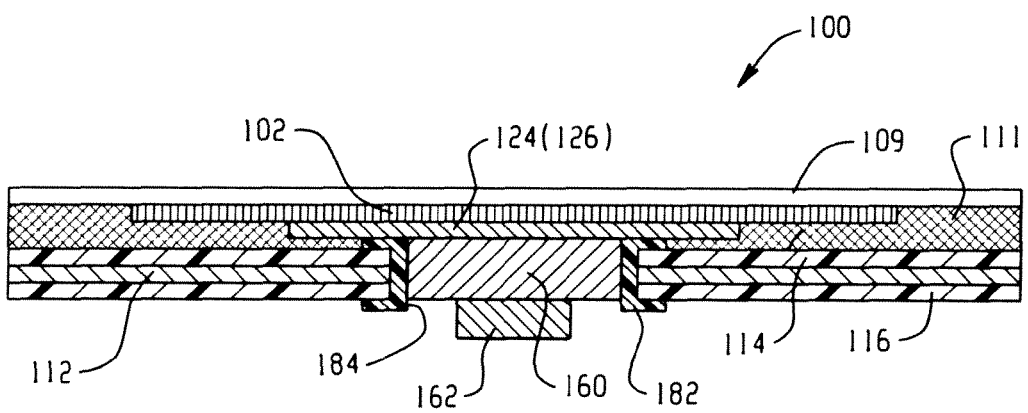

In a manner similar to the embodiment of FIGS. 5-6, precut insulators 180, 182 may be provided to also limit the potential for shorting between the external bus connection and the backsheet. Again, internal openings 184 in the precut insulator or washer are preferably sized slightly less than the opening 120 (122) through the backsheet, and the outer perimeter 186 is sufficient to provide suitable protection around the backsheet opening. FIG. 16 illustrates the positioning of the first and second precut insulators 180, 182 on opposite faces of the backsheet 110 before the application of the external bus, while FIG. 17 is a cross-sectional illustration where the conductive cured viscous adhesive 160 and external bus 162 are particularly illustrated. As will be appreciated from FIG. 17, the precut isolator and particularly the dimensioning of the inner openings 184 serve as a suitable insulator between the conductive materials of the cured viscous adhesive 160, the internal patch 124 (126), and the metal foil, particularly the inner perimeter edge along the opening through the backsheet.

The disclosure has been described with respect to preferred embodiments. Obviously, modifications, alterations, and associated benefits may be contemplated by one skilled in the art. For example, although the proposed solutions find particular use in large area OLED devices that use electrical feed-through openings, selected aspects may also find application in OLED devices in general. The subject disclosure should not be limited to the particular examples described above but instead through the following claims.

What is claimed is:

1. A generally planar, flexible organic light source assembly comprising:
   a generally planar, flexible organic light emitting member having at least one organic light emitting layer disposed between cathode and anode layers, the light emitting member having opposite first and second surfaces;
   an impermeable backsheet having an opening generally extending in a first direction from a first surface to a second surface of the backsheet, the opening having a first dimension measured in a direction substantially perpendicular to the first direction, the backsheet having an exposed conductive portion in the opening through the backsheet, the backsheet generally disposed along the first surface of the light emitting member;
   an electrically conductive patch received over one end of the opening; and
   a generally open center shaped insulator having an interior opening, second dimension less than the first dimension of the backsheet opening, and an outer perimeter, third dimension greater than the first dimension of the backsheet opening, the insulator generally disposed along one of first and second surfaces of the backsheet between the conductive patch and the exposed conductive portion of the backsheet in the opening to mitigate a risk of electrical contact therebetween.

2. The light source assembly of claim 1 wherein the insulator includes a precut first insulator washer generally received along the first surface of the backsheet around the opening.

3. The light source assembly of claim 2 wherein the insulator includes a precut second insulator washer generally received along the second surface of the backsheet around the opening.

4. The light source assembly of claim 3 wherein the second insulator washer has an interior opening dimensioned less than the opening in the backsheet.

5. The light source assembly of claim 1 wherein the insulator is at least partially positioned in covering relation along an inner terminal edge of the conductive portion of the backsheet.

6. The light source assembly of claim 1 wherein the insulator is at least partially positioned along an inner edge of the backsheet opening.

7. The light source assembly of claim 1 wherein the insulator is coated with an adhesive that forms a seal around the exposed conductive portion in the backsheet opening.

8. A method of manufacturing a generally planar, flexible light source assembly comprising:
   providing a generally planar, flexible light emitting member having at least one organic emitting layer between cathode and anode layers, the light emitting member having opposite first and second surfaces;
   locating an impermeable backsheet having an opening generally extending in a first direction from a first surface to a second surface of the backsheet, the opening having a first dimension measured in a direction substantially perpendicular to the first direction, the backsheet having an exposed conductive portion at an opening through the backsheet along the first surface of the light emitting member;
   positioning an electrically conductive patch between the light emitting member and the impermeable backsheet, the patch being at least partially over the opening; and
   applying a generally open center shaped insulator having an interior opening, second dimension less than the first dimension of the backsheet opening, and an outer perimeter, third dimension greater than the first dimension of the backsheet opening, the insulator generally disposed between the patch and the exposed conductive portion of the backsheet in the opening to mitigate a risk of electrical contact therebetween.

9. The method of claim 8 wherein the applying step includes introducing an electrically insulative material around the opening.

10. The method of claim 8 wherein the applying step includes coating an inner surface of the opening with an electrically insulative material.

11. The method of claim 8 further comprising preforming insulator washers.

12. The method of claim 11 wherein the preforming step includes dimensioning openings through the washers to be less than the backsheet opening.

13. The method of claim 8 further comprising rounding an edge of the backsheet opening.

14. The method of claim 13 wherein the rounding step includes laser cutting the backsheet opening to provide a burr-free edge.

15. The method of claim 8 further comprising rounding an edge of the cover.

16. The method of claim 15 wherein the rounding step includes laser cutting the cover to provide a burr-free edge.

17. An organic light emitting diode (OLED) device comprising:
   a generally planar, flexible light emitting member;
   an impermeable backsheet mounted along the light emitting member and having a conductive portion covered with an electrically insulative film, and an opening through the backsheet generally extending in a first direction from a first surface to a second surface of the backsheet, the opening having a first dimension measured in a direction substantially perpendicular to the first direction, the backsheet having an exposed conductive portion;
   a patch between the light emitting member and the impermeable backsheet, the patch dimensioned for overlying receipt over the opening; and
   an open center shaped insulator having an interior opening, second dimension less than the first dimension of the backsheet opening, and an outer perimeter, third dimension greater than the first dimension of the backsheet opening, the insulator generally disposed between the patch and the backsheet opening to mitigate a risk of electrical contact therebetween.

18. The OLED device of claim 17 wherein the insulator includes a precut washer formed from an electrically insulative material and having a passage therethrough.

19. The OLED device of claim 17 wherein the insulator includes an electrically insulative material introduced into the backsheet opening.

* * * * *